(12) United States Patent
Jang

(10) Patent No.: US 10,663,854 B2
(45) Date of Patent: *May 26, 2020

(54) METHOD OF FABRICATING A PHOTOMASK

(71) Applicant: SK hynix Inc., Gyeonggi-do (KR)

(72) Inventor: Dong Sik Jang, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/395,852

(22) Filed: Apr. 26, 2019

(65) Prior Publication Data

US 2019/0250500 A1   Aug. 15, 2019

Related U.S. Application Data

(63) Continuation of application No. 15/064,348, filed on Mar. 8, 2016, now Pat. No. 10,317,791.

(30) Foreign Application Priority Data

Nov. 5, 2015   (KR) ........................ 10-2015-0154958

(51) Int. Cl.
   *G03F 1/26*    (2012.01)
   *G03F 1/78*    (2012.01)
   *G03F 1/80*    (2012.01)

(52) U.S. Cl.
   CPC ................. *G03F 1/26* (2013.01); *G03F 1/78* (2013.01); *G03F 1/80* (2013.01)

(58) Field of Classification Search
   CPC ................. G03F 1/26; G03F 1/78; G03F 1/80
   See application file for complete search history.

(56) References Cited

U.S. PATENT DOCUMENTS

| 8,071,261 | B2 * | 12/2011 | Gutmann | G03F 1/29 |
| | | | | 430/311 |
| 10,317,791 | B2 * | 6/2019 | Jang | G03F 1/78 |
| 2008/0102382 | A1 * | 5/2008 | Waiblinger | G03F 1/30 |
| | | | | 430/5 |

* cited by examiner

*Primary Examiner* — Daborah Chacko-Davis
(74) *Attorney, Agent, or Firm* — IP & T Group LLP

(57) ABSTRACT

A method of fabricating a photomask comprising providing a photomask blank including a phase shifting layer, a first light blocking layer, a first resist layer, a second light blocking layer and a second resist layer stacked sequentially in this order on a substrate, forming second resist patterns, forming second light blocking patterns, forming first resist patterns, forming first light blocking patterns and phase shifting patterns, removing the first resist patterns, and selectively removing at least one of the first light blocking patterns, wherein the second resist layer has a thickness such that all of the second resist layer is removed while the first resist layer is patterned for exposing the second light blocking layer.

7 Claims, 13 Drawing Sheets

METHOD OF FABRICATING A PHOTOMASK

CROSS-REFERENCE TO RELATED APPLICATIONS

The present application is a continuation application of U.S. patent application Ser. No. 15/064,348 filed on Mar. 8, 2016, which claims priority under 35 U.S.C 119(a) to Korean Patent Application No. 10-2015-0154958, filed on Nov. 5, 2015, which is incorporated herein by reference in its entirety.

BACKGROUND

1. Technical Field

Various embodiments of the present disclosure relate to a method of fabricating a photomask.

2. Related Art

Highly integrated semiconductor devices exhibit improved operation speed and lower power consumption. Various advanced process technologies have been proposed for reducing the minimum feature size of circuit patterns, such as interconnection patterns, and contact hole patterns employed for electrically connecting the interconnection patterns. For example, various advanced photolithography technologies have been used for forming fine patterns. Generally, photolithography processes employ photomasks, exposure apparatuses and resist materials all of which are important in minimizing the size of the circuit patterns.

Generally, forming accurate photomask patterns on a mask substrate require to accurately pattern a resist layer of a photomask blank. Generally, a phase shift photomask blank may include a phase shifting layer, a light blocking layer and a resist layer which are stacked sequentially on a substrate. Typically, the resist layer is patterned for forming resist patterns, whereas the light blocking and the phase shifting layers are patterned using the resist patterns for forming light blocking patterns and phase shifting patterns, respectively. In such a case, the pitch sizes of the light blocking patterns and the phase shifting patterns are determined by the pitch size of the resist patterns. The resist patterns may act as etch buffers or etch masks while an etch process for patterning the light blocking layer is performed. Thus, according to existing processes, the resist layer should be formed to have at least a sufficient thickness for accommodating the above processes. Increasing the thickness of the resist layer generally may improve the accuracy of the light blocking and the phase shifting patterns, however, it may make it more difficult to accurately pattern the resist layer. Accordingly, it is generally difficult to form accurate light blocking and phase shifting patterns.

SUMMARY

Various embodiments are directed to methods of fabricating photomasks.

According to an embodiment, there is provided a method of fabricating a photomask. The method includes providing a photomask blank having a phase shifting layer, a first light blocking layer, a first resist layer, a second light blocking layer and a second resist layer which are stacked sequentially in this order on a substrate. The second resist patterns are formed by patterning the second resist layer. The second light blocking patterns are formed by patterning the second light blocking layer using an etch process employing the second resist patterns as etch masks. The first resist patterns are formed by patterning the first resist layer using an etch process employing the second light blocking patterns as etch masks. The first light blocking patterns and the phase shifting patterns are formed by patterning the first light blocking layer and the phase shifting patterns by patterning the first light blocking layer and the phase shifting layer using an etch process employing the first resist patterns as etch masks. The first resist patterns are then removed. At least one of the first light blocking patterns is selectively removed. The second resist layer has a thickness such that all of the second resist layer is removed while the first resist layer is patterned for exposing the second light blocking layer.

According to other embodiment, there is provided a method of fabricating a photomask. The method includes providing a photomask blank having a first light blocking layer, a first resist layer, a second light blocking layer and a second resist layer which are stacked sequentially on a substrate. The second resist patterns are formed by patterning the second resist layer. The second light blocking patterns are formed by patterning the second light blocking layer using an etch process employing the second resist patterns as etch masks. The first resist patterns are formed by patterning the first resist layer using an etch process employing the second light blocking patterns as etch masks. The first light blocking patterns by patterning the first light blocking layer using an etch process employing the first resist patterns as etch masks. The first resist patterns are then removed. The second resist layer has a thickness such that all of the second resist layer is removed while the first resist layer is patterned for exposing the second light blocking layer.

BRIEF DESCRIPTION OF THE DRAWINGS

Various embodiments of the present disclosure will become more apparent in view of the attached drawings and accompanying detailed description, in which.

DESCRIPTION OF SPECIFIC EMBODIMENTS

It will be understood that although the terms first, second, third and so on may be used herein to describe various elements, these elements should not be limited by these terms. These terms are only used to distinguish one element from another element. Thus, a first element in some embodiments could be termed a second element in other embodiments without departing from the teachings of the present disclosure. It will also be understood that when an element is referred to as being located "on," "over," "above," "under," "beneath," "below," "side," or "aside" another element, it may directly contact the other element, or at least one intervening element may be present therebetween. Accordingly, the terms such as "on," "over," "above," "under," "beneath," "below," "side," "aside," and the like that are used herein are for the purpose of describing only a position relationship of two elements and are not intended to limit the scope of the present disclosure. It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
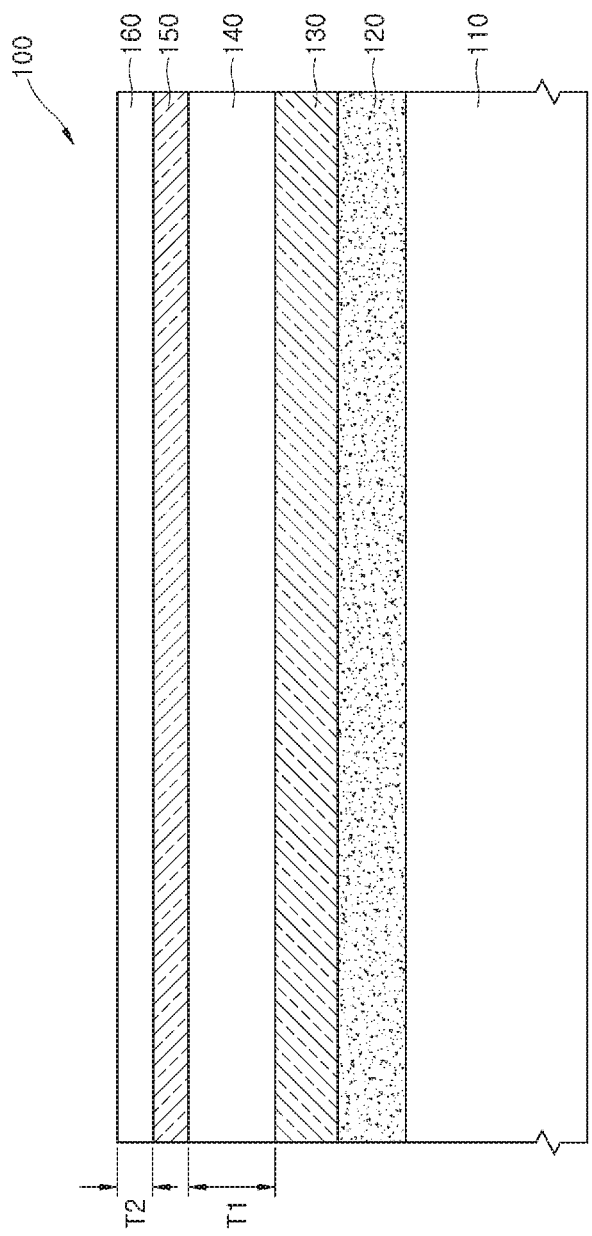
FIG. 1 is a cross-sectional view of a phase shift photomask blank, according to an embodiment of the present disclosure.

FIG. 1 is a cross-sectional view of a phase shift photomask blank 100 according to an embodiment.

Referring to FIG. 1, the phase shift photomask blank 100 may include a phase shifting layer 120, a first light blocking layer 130, a first resist layer 140, a second light blocking layer 150 and a second resist layer 160 all of which are stacked sequentially on a substrate 110. In an embodiment the order of the layers may be as shown in FIG. 1.

The substrate 110 may be or include a light transmitting material, for example, a quartz material, a glass material, a silicon material, a silicon nitride material or a silicon oxynitride material.

The phase shifting layer 120 may be disposed on the substrate 110. The phase shifting layer 120 may be or include any suitable material. In an embodiment, the phase shifting layer 120 may be or include a molybdenum silicide (MoSi) layer. The phase shifting layer 120 may shift a phase of a light passing therethrough by about 170 degrees to about 190 degrees. That is, a phase of a light penetrating all of the phase shifting layer 120 and the light transmitting substrate 110 may precede a phase of a light penetrating only the light transmitting substrate 110 by about 170 degrees to about 190 degrees. The phase shifting layer 120 may have a light transmittance of from about 4% to about 50%.

The first light blocking layer 130 may be disposed on the phase shifting layer 120. The first light blocking layer 130 may be or include any suitable material. For example, the first light blocking layer 130 may be or include a chrome (Cr) layer, an aluminum (Al) layer, a tantalum (Ta) layer or a titanium nitride (TiN) layer. The first light blocking layer 130 may have a light transmittance of at most 5%.

The first resist layer 140 may be disposed on the first light blocking layer 130. The first resist layer 140 and the second light blocking layer 150 may act as etch buffer layers while the first light blocking layer 130 is etched. Thus, at least the first resist layer 140 should have a sufficient thickness T1 so that the first resist layer 140 remains even after the first light blocking layer 130 is etched. That is, an initial thickness (i.e., the thickness T1) of the first resist layer 140 may be determined so that the first resist layer 140 remains to have a certain thickness even after the first resist layer 140 is exposed to an etch process for patterning the first light blocking layer 130. The initial thickness of the first resist layer 140 may be greater than the certain thickness of the remaining first resist layer after the first light blocking layer 130 is patterned. In an embodiment, the thickness T1 of the first resist layer 140 may be at least 800 angstroms.

The second light blocking layer 150 may be disposed on the first resist layer 140. As described above, the second light blocking layer 150 and the first resist layer 140 may act as etch buffer layers while the first light blocking layer 130 is etched. The second light blocking layer 150 may be etched while the first light blocking layer 130 is etched. Specifically, the second light blocking layer 150 may include a material that can be completely removed before an etch process for patterning the first light blocking layer 130 is completed. Thus, the second light blocking layer 150 may include a material having a higher etch rate than an etch rate of the first light blocking layer 130. In an embodiment, the second light blocking layer 150 may be provided by adding oxygen atoms to the same material employed for the first light blocking layer 130. The second light blocking layer 150 may have a smaller thickness than a thickness of the first light blocking layer 130.

The second resist layer 160 may be disposed on the second light blocking layer 150. The second resist layer 160 directly affects the pitch or the width of the fine patterns. Thus, the second resist layer 160 may have a thickness T2 that is sufficiently thin for forming fine patterns more accurately. Accordingly, the thickness T2 of the second resist layer 160 may be less than the thickness T1 of the first resist layer 140. For example, the thickness T2 of the second resist layer 160 may be from about 20% to about 50% of the thickness T1 of the first resist layer 140. In an embodiment, in order for forming fine patterns having a width of from about 15 nanometers to about 25 nanometers, the thickness T2 of the second resist layer 160 may be of from about 200 angstroms to about 400 angstroms.

FIGS. 2 to 7 are cross-sectional views illustrating a method of fabricating a phase shift photomask using the phase shift photomask blank 100 shown in FIG. 1.

Figure 2:
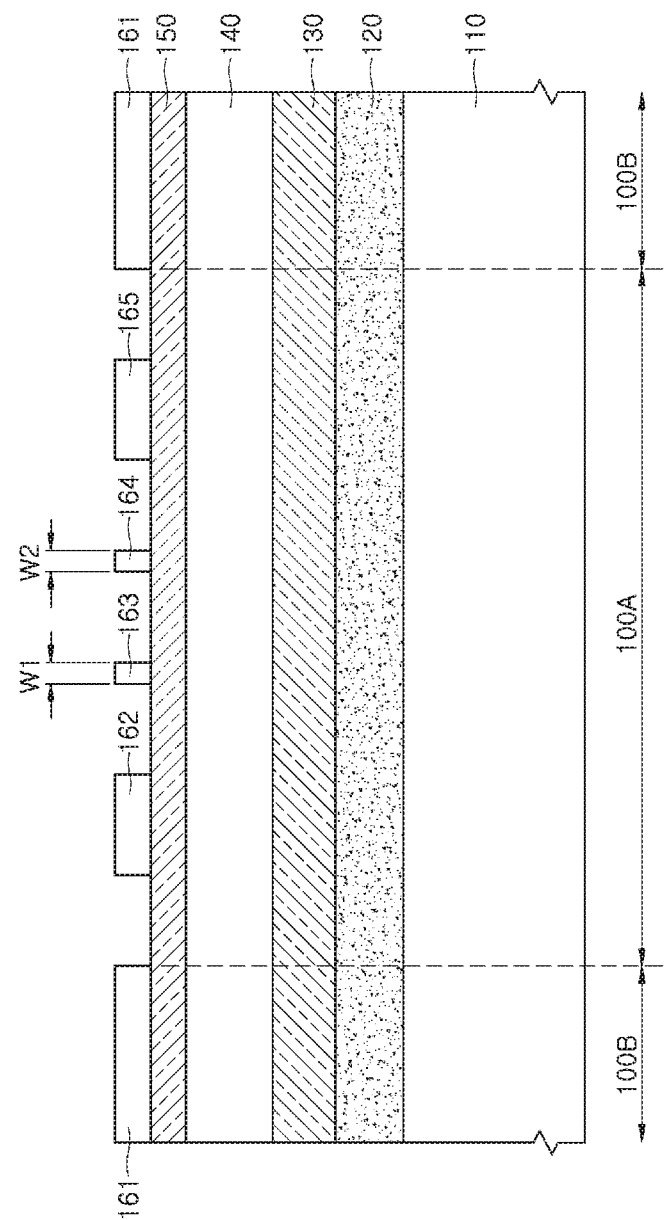
FIGS. 2 to 7 are cross-sectional views illustrating a method of fabricating a phase shift photomask using the phase shift photomask blank shown in FIG. 1.

Referring to FIG. 2, after the phase shift photomask blank 100 is provided, the second resist layer 160 of the phase shift photomask blank 100 may be patterned for forming second resist patterns 161 to 165. The second resist layer 160 may be patterned using an electron beam (e-beam) lithography process. The second resist patterns 162 to 165 may be formed in a pattern region 100A, and the second resist pattern 161 may be formed in a frame region 100B. In the present embodiment, pattern images of the pattern region 100A may be transferred onto a wafer while the frame region 100B does not include patterns whose images are transferred onto the wafer. The frame region 100B may be disposed to surround the pattern region 100A. The second resist pattern 161 may be formed to cover an entire surface of the second light blocking layer 150 in the frame region 100B. The second resist patterns 162 to 165 may be formed to cover partially the second light blocking layer 150 in the pattern region 100A. Accordingly, portions of the second light blocking layer 150 in the pattern region 100A may be exposed by the second resist patterns 162 to 165.

The second resist patterns 162 to 165 formed in the pattern region 100A may have the same width. The second resist patterns 162 to 165 may have different widths. For example, the second resist patterns 162 to 165 may have two different widths. For example, a width of the second resist patterns 162 and 165 may be greater than a width of the second resist patterns 163 and 164 as shown in FIG. 2. More specifically, in the embodiment of FIG. 2, the second resist patterns 163 and 164 may correspond to fine patterns having first and a second width W1, W2, respectively. The first width W1 may be equal to or different from the second width W2. Even though the second resist patterns 163 and 164 are fine patterns having relatively narrow widths, no collapse of the second resist patterns 163 and 164 may occur because the second resist patterns 163 and 164 are formed to be sufficiently thick to prevent such a collapse.

Figure 3:
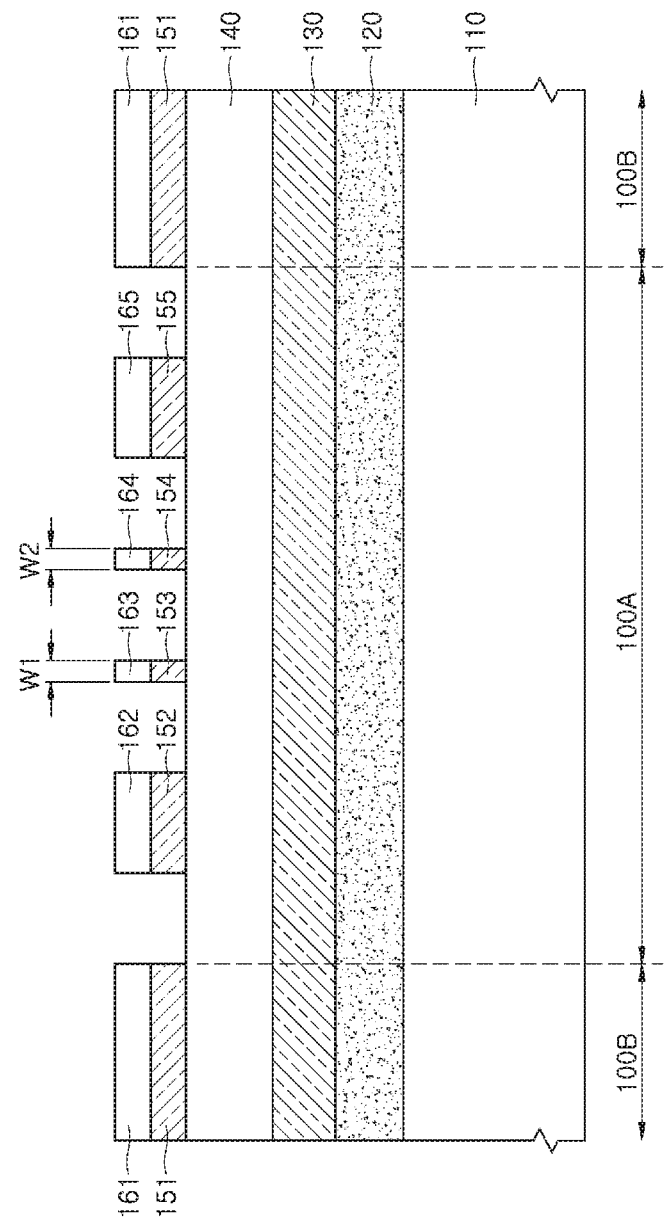

Referring to FIG. 3, the second light blocking layer 150 may be etched using the second resist patterns 161 to 165 as etch masks, thereby forming second light blocking patterns 151 to 155 which are aligned with the second resist patterns 161 to 165. Portions of the first resist layer 140 may be exposed by the second light blocking patterns 151 to 155 and the second resist patterns 161 to 165. The second light blocking patterns 153 and 154 may have substantially the same width as the second resist patterns 163, and 164. That is, the second light blocking patterns 153 and 154 may have the first and second widths W1, W2, respectively.

Figure 4:
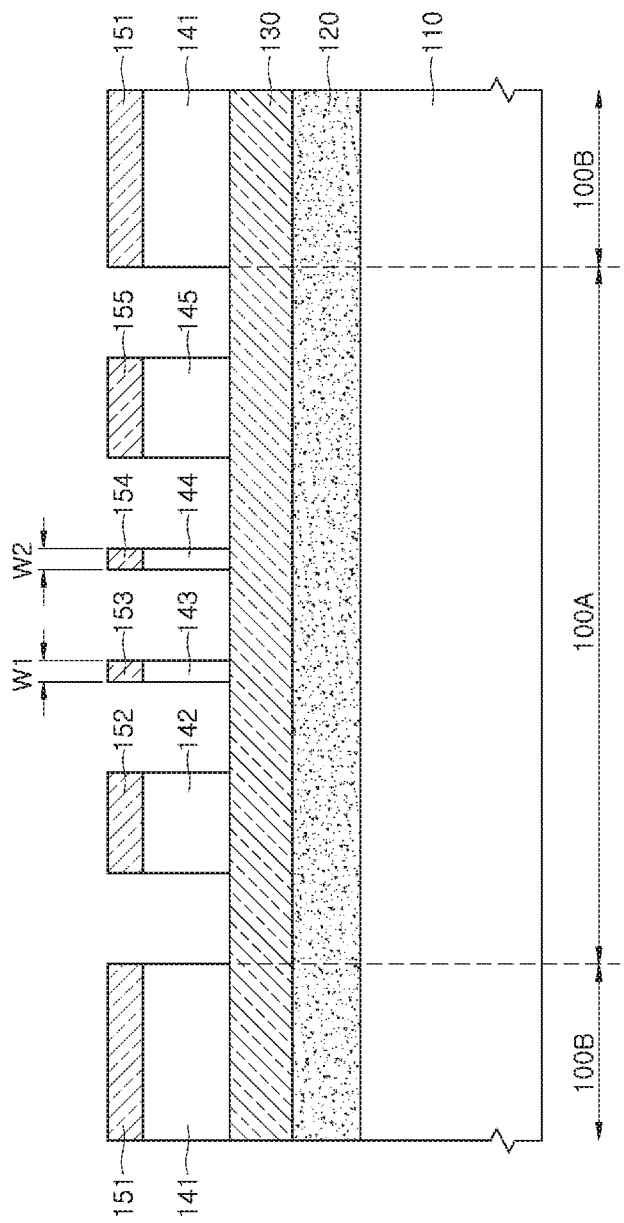

Referring to FIG. 4, the first resist layer 140 may be etched using the second resist patterns 161 to 165 and the second light blocking patterns 151 to 155 as etch masks, thereby forming first resist patterns 141 to 145 which are aligned with the second resist patterns 161 to 165 and the second light blocking patterns 151 to 155. The etch process for forming the first resist patterns 141 to 145 may be performed using an anisotropic dry etch process. The anisotropic dry etch process may employ an oxygen gas as an etch gas. Since the second resist patterns 161 to 165 are thinner than the first resist layer 140, the second resist patterns 161 to 165 may be removed while the first resist layer 140 is etched for forming the first resist patterns 141 to 145. After the first resist patterns 141 to 145 are formed, portions of the first light blocking layer 130 may be exposed. The first resist patterns 143 and 144 may have substantially the same width as the second light blocking patterns 153 and 154, respectively. That is, the first resist patterns 143 and 144 may have the first and second widths W1 and W2, respectively.

Figure 5:
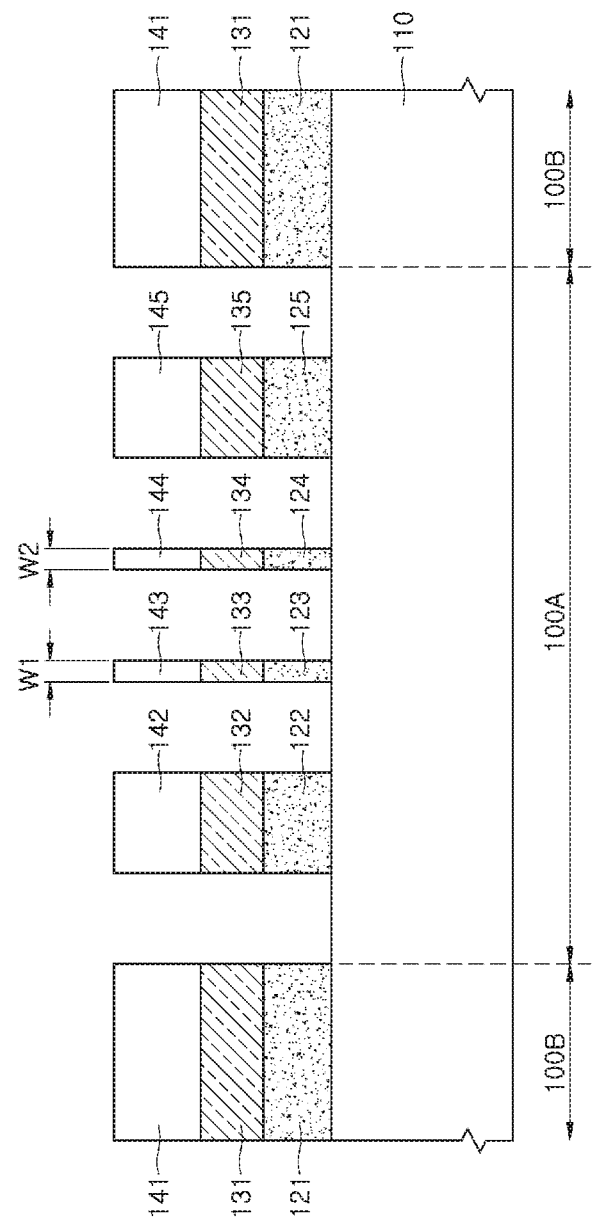

Referring to FIG. 5, the first light blocking layer 130 may be etched using the second light blocking patterns 151 to 155 and the first resist patterns 141 to 145 as etch masks, thereby forming first light blocking patterns 131 to 135 which are aligned with the second light blocking patterns 151 to 155 and the first resist patterns 141 to 145. Subsequently, the phase shifting layer 120 may additionally be etched using the second light blocking patterns 151 to 155 and the first resist patterns 141 to 145 as etch masks, thereby forming phase shifting patterns 121 to 125. Since a thickness of the second light blocking patterns 151 to 155 is less than a thickness of the first light blocking layer 130 and an etch rate of the second light blocking patterns 151 to 155 is higher than an etch rate of the first light blocking layer 130, the second light blocking patterns 151 to 155 may be removed while the first light blocking layer 130 is etched for forming the first light blocking patterns 131 to 135. After the first light blocking patterns 131 to 135 and the phase shifting patterns 121 to 125 are formed, portions of the substrate 110 may be exposed. The first light blocking patterns 133 and 134 may have substantially the same width as the first resist patterns 143 and 144, respectively. Similarly, the phase shifting patterns 123 and 124 may have substantially the same width as the first resist patterns 143 and 144, respectively. That is, the first light blocking pattern 133 and the phase shifting pattern 123 may both have the first width W1, whereas the first light blocking pattern 134 and the phase shifting pattern 124 may both have the second width W2.

Figure 6:
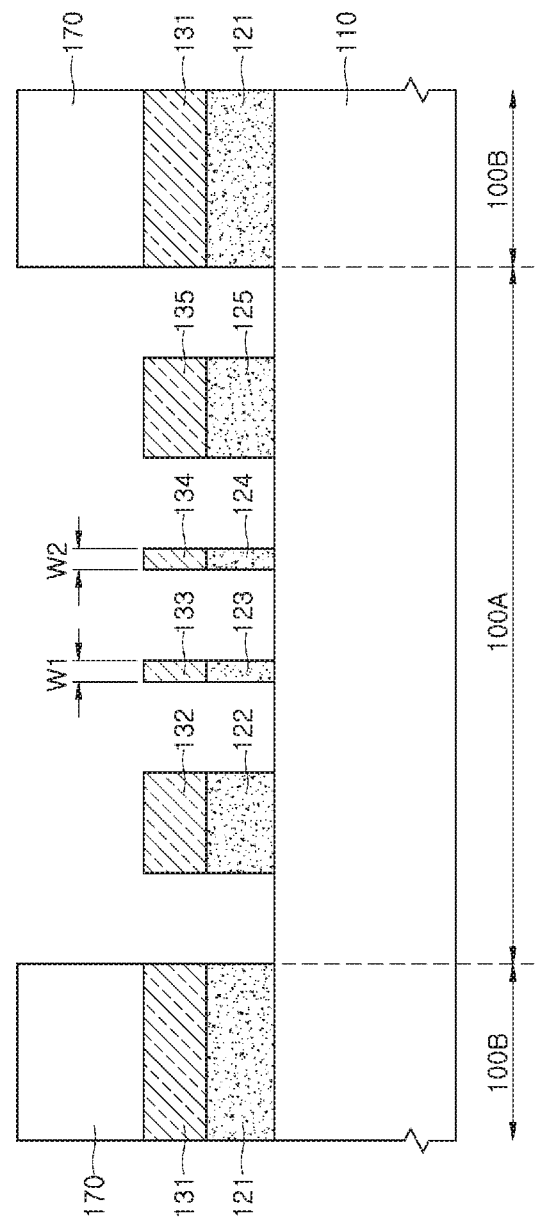

Referring to FIG. 6, the first resist patterns 141 to 145 may be removed to expose top surfaces of the first light blocking patterns 132 to 135 in the pattern region 100A and a top surface of the first light blocking pattern 131 in the frame region 100B. A third resist pattern 170 may be formed to cover the first light blocking pattern 131 in the frame region 100B. The third resist pattern 170 may be formed to expose the first light blocking patterns 132 to 135 and the substrate 110 in the pattern region 100A.

Figure 7:
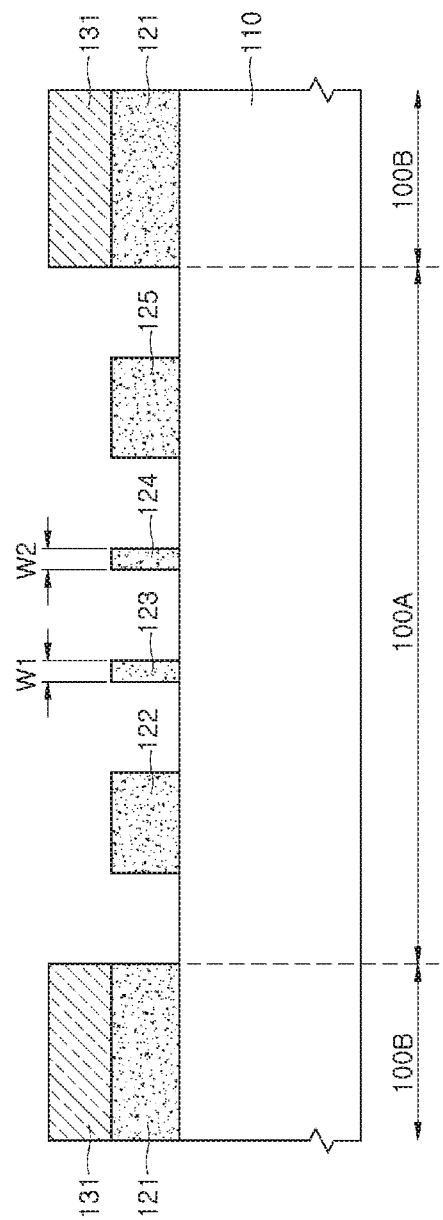

Referring to FIG. 7, the first light blocking patterns 132 to 135 in the pattern region 110A may be removed using an etch process that employs the third resist pattern 170 as an etch mask. As a result of removal of the first light blocking patterns 132 to 135, the phase shifting patterns 122 to 125 in the pattern region 110A may be exposed. After the first light blocking patterns 132 to 135 are removed, the third resist pattern 170 may be removed. As a result, a phase shift photomask fabricated by the above processes may include the phase shifting patterns 122 to 125 exposed in the pattern region 110A and the phase shifting pattern 121 covered with the first light blocking pattern 131 in the frame region 100B.

Figure 8:
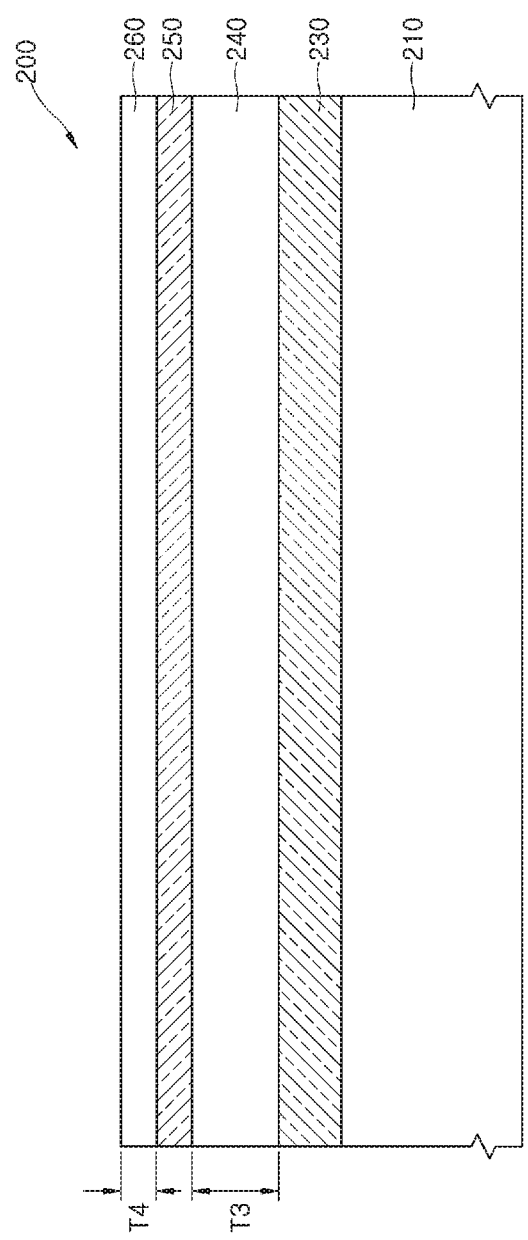
FIG. 8 is a cross-sectional view of a binary photomask blank according to an embodiment of the present disclosure.

FIG. 8 is a cross-sectional view of a binary photomask blank 200, according to an embodiment of the invention.

Referring to FIG. 8, the binary photomask blank 200 may include a first light blocking layer 230, a first resist layer 240, a second light blocking layer 250 and a second resist layer 260 which are stacked sequentially on a substrate 210. The layers may be stacked in the order shown in FIG. 8.

The substrate 210 may include a light transmitting material, for example, a quartz material, a glass material, a silicon material, a silicon nitride material or a silicon oxynitride material.

The first light blocking layer 230 may be disposed on the substrate 210. The first light blocking layer 230 may include a chrome (Cr) layer, an aluminum (Al) layer, a tantalum (Ta) layer or a titanium nitride (TiN) layer. The first light blocking layer 230 may have a light transmittance of at most 5%.

The first resist layer 240 may be disposed on the first light blocking layer 230. The first resist layer 240 and the second light blocking layer 250 may act as etch buffer layers while the first light blocking layer 230 is etched. Thus, at least the first resist layer 240 should have a sufficient thickness T3 so that the first resist layer 240 remains even after the first light blocking layer 230 is etched. That is, an initial thickness (i.e., the thickness T3) of the first resist layer 240 may be determined so that the first resist layer 240 remains to have a certain thickness even after the first resist layer 240 is exposed to an etch process for patterning the first light blocking layer 230. The initial thickness of the first resist layer 240 may be greater than the certain thickness of the remaining first resist layer after the first light blocking layer 230 is patterned. In an embodiment, the thickness T3 of the first resist layer 240 may be at least 800 angstroms.

The second light blocking layer 250 may be disposed on the first resist layer 240. As described above, the second light blocking layer 250 and the first resist layer 240 may act as etch buffer layers while the first light blocking layer 230 is etched. The second light blocking layer 250 may be etched while the first light blocking layer 230 is etched. Specifically, the second light blocking layer 250 may include a material that can be completely removed before an etch process for patterning the first light blocking layer 230 is completed. Thus, the second light blocking layer 250 include a material having a higher etch rate than an etch rate of the first light blocking layer 230. In an embodiment, the second light blocking layer 250 may be provided by adding oxygen atoms to the same material employed as the first light blocking layer 230. The second light blocking layer 250 may a smaller thickness than a thickness of the first light blocking layer 230.

The second resist layer 260 may be disposed on the second light blocking layer 250. The second resist layer 260 may directly affect the pitch or width of the fine patterns. Thus, the second resist layer 260 may have a thickness T4 that is sufficiently thin for accurately forming fine patterns. Accordingly, the thickness T4 of the second resist layer 260 may be less than the thickness T3 of the first resist layer 240. For example, the thickness T4 of the second resist layer 260 may be from about 20% to about 50% of the thickness T3 of the first resist layer 240. In an embodiment, for forming fine patterns having a width of from about 15 nanometers to about 25 nanometers, the thickness T4 of the second resist layer 260 may be of from about 200 angstroms to about 400 angstroms.

FIGS. 9 to 13 are cross-sectional views illustrating a method of fabricating a binary photomask using the binary photomask blank 200 shown in FIG. 8.

Figure 9:
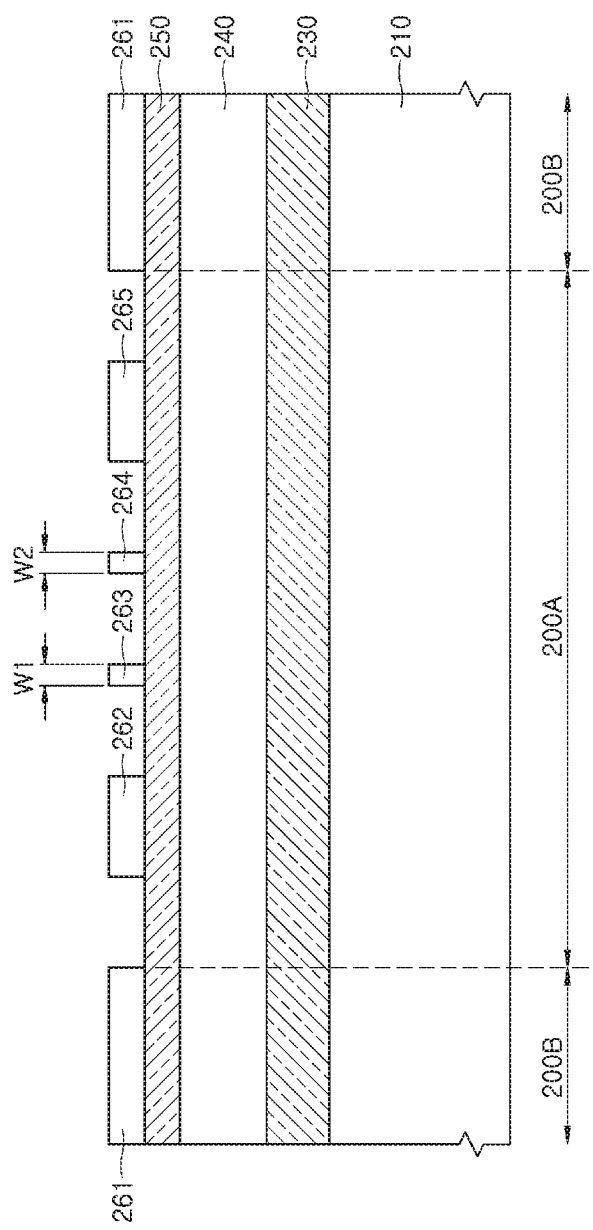
FIGS. 9 to 13 are cross-sectional views illustrating a method of fabricating a binary photomask using the binary photomask blank shown in FIG. 8.

Referring to FIG. 9, after the binary photomask blank 200 is provided, the second resist layer 260 of the binary photomask blank 200 may be patterned for forming second resist patterns 261 to 265. For example, the second resist layer 260 may be patterned using an electron beam (e-beam) lithography process. The second resist patterns 262 to 265 may be formed in a pattern region 200A, whereas the second resist pattern 261 may be formed in a frame region 200B. In the present embodiment, pattern images of the pattern region 200A may be transferred onto a wafer. By contrast, the frame region 200B does not include patterns whose images are transferred onto the wafer. The frame region 200B may be disposed to surround the pattern region 200A. The second resist pattern 261 may be formed to cover an entire surface of the second light blocking layer 250 in the frame region 200B. The second resist patterns 262 to 265 may be formed to cover partially the second light blocking layer 250 in the pattern region 200A. Accordingly, portions of the second light blocking layer 250 in the pattern region 200A may be exposed by the second resist patterns 262 to 265.

The second resist patterns 262 to 265 formed in the pattern region 200A may have the same width. The second resist patterns 262 to 265 may have different widths. The second resist patterns 262 to 265 may have two different widths. For example, a width of the second resist patterns 262 and 265 may be greater than a width of the second resist patterns 263 and 264. In the present embodiment, the second resist patterns 263 and 264 may correspond to fine patterns having first and second widths W3 and W4, respectively. The first width W3 may be equal to or different from the second width W4. Even though the second resist patterns 263 and 264 are fine patterns having relatively narrow widths, no collapse of the second resist patterns 263 and 264 may occur because the second resist patterns 263 and 264 are formed to be sufficiently thick to prevent such collapse.

Figure 10:
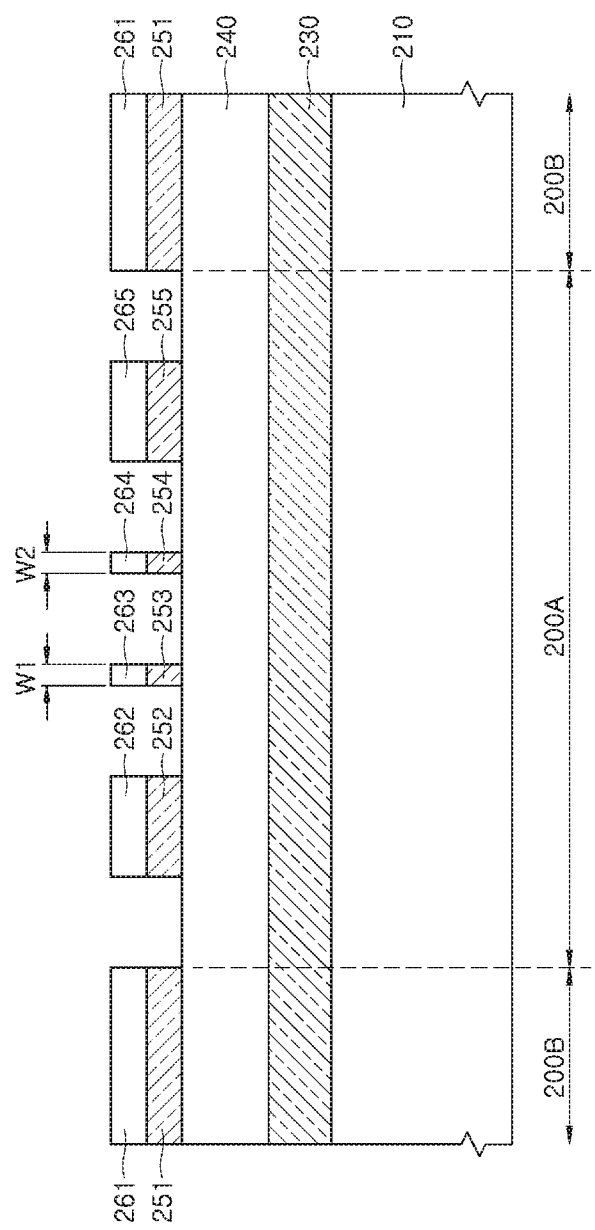

Referring to FIG. 10, the second light blocking layer 250 may be etched using the second resist patterns 261 to 265 as etch masks, thereby forming second light blocking patterns 251 to 255 which are aligned with the second resist patterns 261 to 265. Portions of the first resist layer 240 may be exposed by the second light blocking patterns 251 to 255 and the second resist patterns 261 to 265. The second light blocking patterns 253 and 254 may have substantially the same width as the second resist patterns 263 and 264. That is, the second light blocking patterns 253 and 254 may have the first and second widths W3 and W4, respectively.

Figure 11:
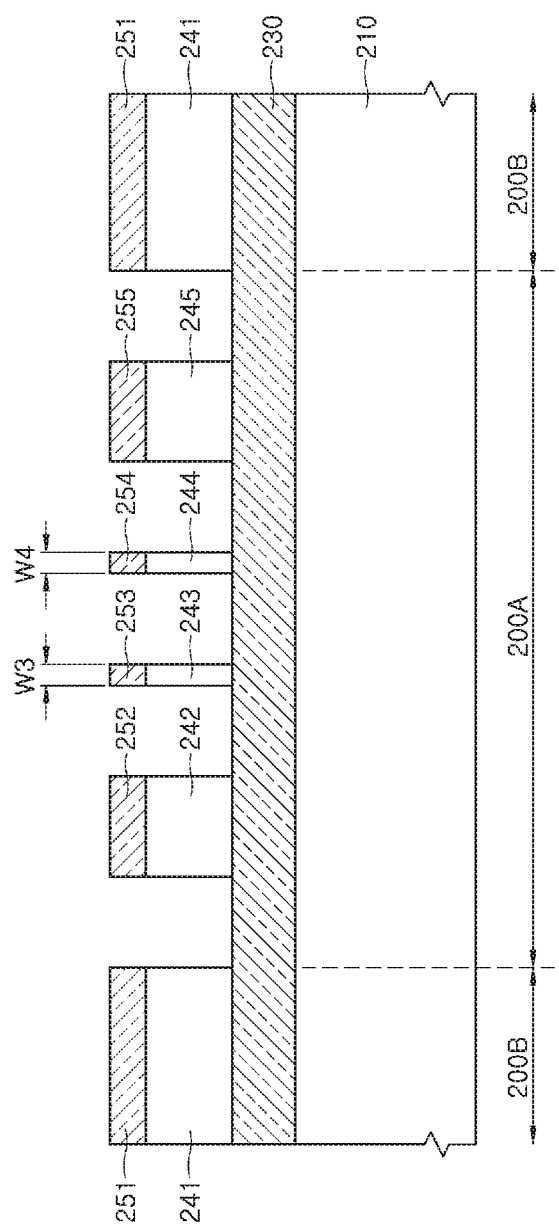

Referring to FIG. 11, the first resist layer 240 may be etched using the second resist patterns 261 to 265 and the second light blocking patterns 251 to 255 as etch masks, thereby forming first resist patterns 241 to 245. The first resist patterns 241 to 245 may be aligned with the second resist patterns 261 to 265 and the second light blocking patterns 251 to 255. The etch process for forming the first resist patterns 241 to 245 may be performed using an anisotropic dry etch process. The anisotropic dry etch process may employ an oxygen gas as an etch gas. Since the second resist patterns 261 to 265 are thinner than the first resist layer 240, the second resist patterns 261 to 265 may be removed while the first resist layer 240 is etched for forming the first resist patterns 241 to 245. After the first resist patterns 241 to 245 are formed, portions of the first light blocking layer 230 may be exposed. The first resist patterns 243 and 244 may have substantially the same width as the second light blocking patterns 253 and 254, respectively. That is, the first resist patterns 243 and 244 may have the first and second widths W3 and W4, respectively.

Figure 12:
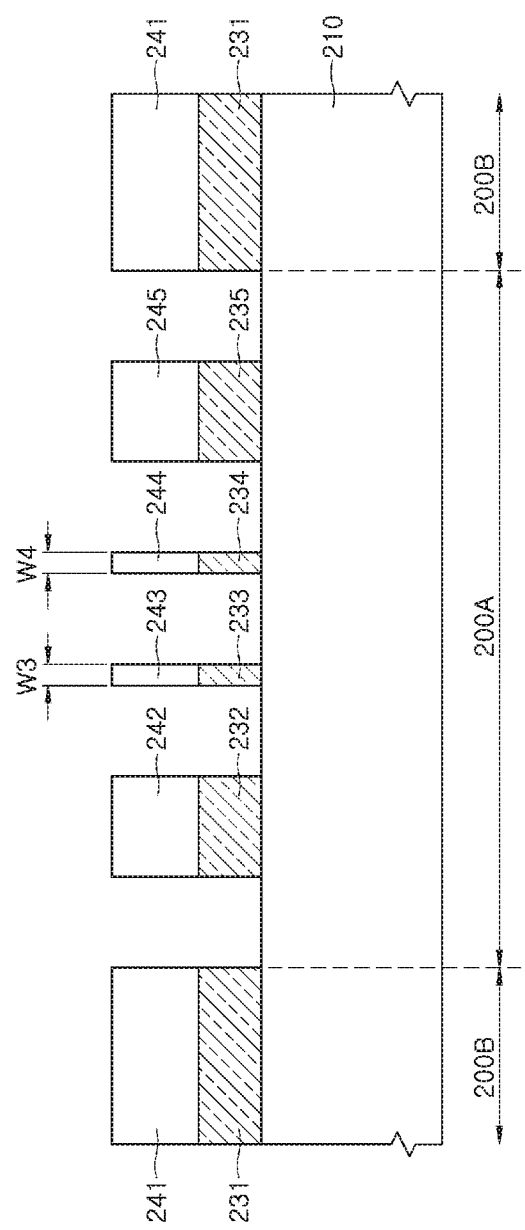

Referring to FIG. 12, the first light blocking layer 230 may be etched using the second light blocking patterns 251 to 255 and the first resist patterns 241 to 245 as etch masks, thereby forming first light blocking patterns 231 to 235. The first light blocking patterns 231 to 235 may be aligned with the second light blocking patterns 251 to 255 and the first resist patterns 241 to 245. Since a thickness of the second light blocking patterns 251 to 255 is less than a thickness of the first light blocking layer 230 and an etch rate of the second light blocking patterns 251 to 255 is higher than an etch rate of the first light blocking layer 230, the second light blocking patterns 251 to 255 may be removed while the first light blocking layer 230 is etched for forming the first light blocking patterns 231 to 235. After the first light blocking patterns 231 to 235 are formed, portions of the substrate 210 may be exposed. The first light blocking patterns 233 and 244 may have substantially the same width as the first resist patterns 243 and 244, respectively. That is, the first light blocking patterns 233 and 234 may have the first and second widths W3 and W4, respectively.

Figure 13:
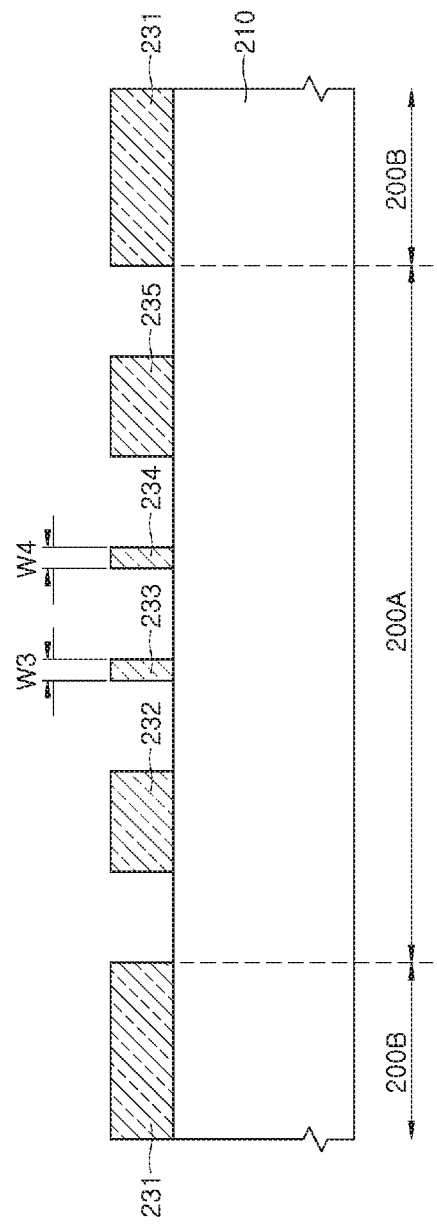

Referring to FIG. 13, the first resist patterns 241 to 245 may be removed to expose top surfaces of the first light blocking patterns 231 to 235. As a result, a binary photomask fabricated by the above processes may include the first light blocking patterns 232 to 235 disposed to expose portions of the substrate 210 in the pattern region 210A and the first light blocking pattern 231 disposed to cover an entire surface of the substrate 210 in the frame region 200B.

The embodiments of the present disclosure have been disclosed above for illustrative purposes. Those of ordinary skill in the art will appreciate that various modifications, additions, and substitutions are possible, without departing from the scope and spirit of the present disclosure as disclosed in the accompanying claims.

What is claimed is:

1. A method of fabricating a photomask, the method comprising:
    providing a photomask blank including a phase shifting layer, a first light blocking layer, a first resist layer, a second light blocking layer and a second resist layer stacked sequentially in this order on a substrate;
    forming second resist patterns by patterning the second resist layer;
    forming second light blocking patterns by patterning the second light blocking layer using an etch process employing the second resist patterns as etch masks;
    forming first resist patterns by patterning the first resist layer using an etch process employing the second light blocking patterns as etch masks;
    forming first light blocking patterns and phase shifting patterns by patterning the first light blocking layer and the phase shifting layer using an etch process employing the first resist patterns as etch masks;
    removing the first resist patterns; and
    selectively removing at least one of the first light blocking patterns,
    wherein the second resist layer has a thickness such that all of the second resist layer is removed while the first resist layer is patterned for exposing the second light blocking layer, and wherein the forming of the second light blocking patterns is performed by patterning the second light blocking layer using an anisotropic dry etch process employing an oxygen gas as an etch gas.

2. The method of claim 1, wherein the forming of the first resist pattern includes removing the second resist patterns during the patterning of the first resist layer.

3. The method of claim 1, wherein the selective removing of at least one of the first light blocking patterns includes:
    forming a third resist pattern that exposes a pattern region of the substrate and covers a frame region of the substrate;
    removing the first light blocking patterns on the pattern region of the substrate; and
    removing the third resist pattern.

4. The method of claim 1,
    wherein the first light blocking layer and the second light blocking layer have a light transmittance of at most 5%,
    the first light blocking layer includes a chrome (Cr) layer, an aluminum (Al) layer, a tantalum (Ta) layer or a titanium nitride (TiN) layer, and
    wherein the second light blocking layer is composed of material added oxygen atoms to the same material employed for the first light blocking layer.

5. A method of fabricating a photomask, the method comprising:
    providing a photomask blank including a first light blocking layer, a first resist layer, a second light blocking layer and a second resist layer which are stacked sequentially on a substrate;
    forming second resist patterns by patterning the second resist layer;
    forming second light blocking patterns by patterning the second light blocking layer using an etch process employing the second resist patterns as etch masks;
    forming first resist patterns by patterning the first resist layer using an etch process employing the second light blocking patterns as etch masks;
    forming first light blocking patterns by patterning the first light blocking layer using an etch process employing the first resist patterns as etch masks; and
    removing the first resist patterns,
    wherein the second resist layer has a thickness such that all of the second resist layer is removed while the first resist layer is patterned for exposing the second light blocking layer, and
    wherein the forming of the second light blocking patterns is performed by patterning the second light blocking layer using an anisotropic dry etch process that employs an oxygen gas as an etch gas.

6. The method of claim 5, wherein the forming of the first resist pattern includes removing the second resist patterns during the pattering of the first resist layer.

7. The method of claim 5,
    wherein the first light blocking layer and the second light blocking layer have a light transmittance of at most 5%,
    the first light blocking layer includes a chrome (Cr) layer, an aluminum (Al) layer, a tantalum (Ta) layer or a titanium nitride (TiN) layer, and
    wherein the second light blocking layer is composed of material added oxygen atoms to the same material employed for the first light blocking layer.

* * * * *